US010998483B1

(12) United States Patent
Manousakis et al.

(10) Patent No.: US 10,998,483 B1
(45) Date of Patent: May 4, 2021

(54) ENERGY REGENERATION IN FUEL CELL-POWERED DATACENTER WITH THERMOELECTRIC GENERATORS

(71) Applicant: Microsoft Technology Licensing, LLC, Redmond, WA (US)

(72) Inventors: Ioannis Manousakis, Redmond, WA (US); Nicholas Andrew Keehn, Kirkland, WA (US); Husam Atallah Alissa, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1 day.

(21) Appl. No.: 16/661,837

(22) Filed: Oct. 23, 2019

(51) Int. Cl.
*H01L 35/32* (2006.01)
*G06F 1/3203* (2019.01)
*H01M 8/04082* (2016.01)
*H01L 35/34* (2006.01)

(52) U.S. Cl.
CPC ............ *H01L 35/32* (2013.01); *G06F 1/3203* (2013.01); *H01M 8/04082* (2013.01); *H01L 35/34* (2013.01)

(58) Field of Classification Search
CPC ................................ H01L 35/32; G06F 1/3203
See application file for complete search history.

(56) References Cited

U.S. PATENT DOCUMENTS

| 8,822,096 | B2* | 9/2014 | Rich | ................. | H01M 8/04373 |
| | | | | | 429/442 |
| 9,059,372 | B2 | 6/2015 | Sicuranza | | |
| 2004/0265662 | A1* | 12/2004 | Brignone | .......... | H01M 8/04186 |
| | | | | | 429/440 |
| 2009/0107536 | A1* | 4/2009 | Sicuranza | .......... | H05K 7/20727 |
| | | | | | 136/205 |
| 2010/0136895 | A1* | 6/2010 | Sgro | ................... | H05K 7/20836 |
| | | | | | 454/184 |
| 2013/0078544 | A1* | 3/2013 | Braithwaite | ........ | H01M 16/006 |
| | | | | | 429/442 |
| 2013/0163193 | A1* | 6/2013 | Ballantine | ............... | H02J 3/387 |
| | | | | | 361/679.47 |

(Continued)

OTHER PUBLICATIONS

Chen, et al., "Integrated Management of Application Performance, Power and Cooling in Data Centers", In IEEE Network Operations and Management Symposium, Apr. 19, 2010, pp. 615-622.

Ebrahimi, et al., "Waste Heat Recovery From Distributed Rack-Based Fuel Cells Using Thermoelectric Generators", In Proceedings of the 17th IEEE Intersociety Conference on Thermal and Thermomechanical Phenomena in Electronic Systems, May 29, 2018, pp. 795-814.

(Continued)

*Primary Examiner* — Vincent H Tran
(74) *Attorney, Agent, or Firm* — Ray Quinney & Nebeker P.C.; Paul N. Taylor (57) ABSTRACT

A method of controlling energy in a datacenter includes receiving a fuel cell operating percentage of an operating capacity of the fuel cell, receiving a fuel cell exhaust temperature, receiving a hot aisle air temperature from a hot aisle of a server computer, determining a temperature delta between the hot aisle air temperature and the fuel cell exhaust temperature, and then allocating virtual machine placements to change a server user percentage relative to a server user capacity percentage target value to optimize the fuel cell operating percentage relative to the fuel cell efficiency target value, the temperature delta relative to the thermoelectric generator efficiency target value, and the server user percentage relative to the server user capacity percentage target value.

20 Claims, 4 Drawing Sheets

(56) References Cited

U.S. PATENT DOCUMENTS

| | | | |
|---|---|---|---|
| 2014/0173299 A1* | 6/2014 | McKnight | G06F 1/206 |
| | | | 713/300 |
| 2014/0372772 A1 | 12/2014 | McKnight et al. | |
| 2015/0138715 A1* | 5/2015 | Chainer | H05K 7/20254 |
| | | | 361/679.31 |
| 2015/0221997 A1* | 8/2015 | Lenk | H01M 10/63 |
| | | | 429/62 |
| 2016/0004263 A1* | 1/2016 | James | F24F 11/0001 |
| | | | 236/94 |
| 2016/0133971 A1* | 5/2016 | Naganuma | H01M 8/0432 |
| | | | 429/434 |
| 2018/0013049 A9* | 1/2018 | Harding | H05K 7/20745 |
| 2018/0228060 A1 | 8/2018 | Alissa et al. | |
| 2019/0354151 A1* | 11/2019 | Imwalle | H05K 7/20836 |
| 2020/0136156 A1* | 4/2020 | Liu | H01M 8/04067 |

OTHER PUBLICATIONS

Gill, et al., "A Taxonomy and Future Directions for Sustainable Cloud Computing: 360 Degree View", In Repository of ArXiv, Dec. 8, 2017, 68 pages.

Lee, et al., "Proactive Thermal Management in Green Datacenters", In the Journal of Supercomputing, vol. 60, No. 2, Jun. 10, 2010, pp. 165-195.

Nathuji, et al., "VPM Tokens: Virtual Machine-Aware Power Budgeting in Datacenters", In Cluster Computing, vol. 12, No. 2, Jan. 23, 2009, pp. 189-203.

"International Search Report and Written Opinion Issued in PCT Application No. PCT/US2020/054874", dated Feb. 1, 2021, 18 Pages.

* cited by examiner

ENERGY REGENERATION IN FUEL CELL-POWERED DATACENTER WITH THERMOELECTRIC GENERATORS

BACKGROUND

Background and Relevant Art

Datacenters receive, store, and process large amounts of data. The energy consumed by the datacenter is conventionally produced elsewhere, resulting in a risk of power failure to the datacenter. On-site generation of energy reduces the risk of power failure to the datacenter and can allow for more efficiency generation and consumption of energy. On-site generation of energy allows for further improvements in energy harvesting and efficiency.

BRIEF SUMMARY

In some embodiments, a method of controlling energy in a datacenter includes receiving a fuel cell operating percentage of an operating capacity of the fuel cell, receiving a fuel cell exhaust temperature, receiving a hot aisle air temperature from a hot aisle of a server computer, and determining a temperature delta between the hot aisle air temperature and the fuel cell exhaust temperature. After determining the temperature delta, the method includes allocating virtual machine placements to the server computer to change a server user percentage relative to a server user capacity percentage target value so as to optimize the fuel cell operating percentage relative to the fuel cell efficiency target value, the temperature delta relative to the thermoelectric generator efficiency target value, and the server user percentage relative to the server user capacity percentage target value.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

The present disclosure relates generally to systems and methods for controlling energy in a datacenter. In some embodiments, the present disclosure describes systems and methods for controlling production and/or consumption of energy in a datacenter. For example, the datacenter includes a plurality of server computers arranged in server racks that consume electrical energy. The electricity may be generated locally (e.g., in a building local to the datacenter building, in the datacenter building, in the room with the server rack) and used to power the server rack. In some embodiments, the generation of the energy produces waste heat. The waste heat can be harvested to provide further electrical energy.

In some embodiments, a system according to the present disclosure includes a server computer and a fuel cell to power the server computer. In some embodiments, the server computer is one of a plurality of server computers arranged in a server rack. The server rack may have 1, 2, 3, 4, 5, 6, 7, 8 or more server computers. In some embodiments, a system according to the present disclosure includes a plurality of server racks. The server computer receives virtual machine (VM) allocations to provide computational services and/or data storage to a plurality of users connected to the server computer via a network connection. Generally, a greater quantity of VM allocations consumes a larger amount of energy from the fuel cell.

In some embodiments, the fuel cell is a solid-oxide fuel cell. In some embodiments, the fuel cell is a hydrogen fuel cell. In some embodiments, the fuel cell is a solid acid fuel cell. In some embodiments, the fuel cell is a carbonate fuel cell. The fuel cell produces electricity through a controlled chemical reaction in the fuel cell, which also produces thermal energy. The fuel cell may have an operating temperature greater than 300° C. In some embodiments, the fuel cell produces exhaust gases with an exhaust gas temperature greater than 300° C. The fuel cell exhaust, therefore, has thermal energy, which can further be harvested to generate electrical energy.

The server computer generates thermal energy during operation that is removed from the server computer and server rack by a flow of air through and/or over the server rack. Incoming air arrives at the server rack via a cold aisle and is directed through and/or over the server rack. The air absorbs thermal energy from the server rack through thermal convection, conduction, and radiation and exits the server rack with a portion of the thermal energy of the server computers therein. The warm air flows away from the server rack in a hot aisle of the ducting and flows toward an exhaust fan.

In some embodiments, the fuel cell exhaust and the hot aisle removing thermal energy from the server rack have a temperature difference or temperature delta that is 50° C., 75° C., 100° C., 125° C., 150° C., 200° C., 250° C., 300° C., or greater. The datacenter may position the ducting of the hot aisle and the ducting of the fuel cell exhaust proximate and/or adjacent to one another. In some embodiments, one or more thermoelectric generators (TEGs) are positioned between the fuel cell exhaust and the hot aisle. The TEGs have a hot terminal positioned in thermal communication with the fuel cell exhaust and a cold terminal in thermal communication with the warm air of the hot aisle. The resulting thermal gradient across the TEGs produces an electrical potential and associated current.

The electrical energy produced by the fuel cell(s) and the TEG(s) may be provided to the server computer(s) to power the server computer(s). In some examples, the fuel cell and the TEGs are directly connected to the server computers to power the server computers. In other examples, the system includes an uninterruptable power supply (UPS) or other energy storage device that receives electrical energy from the fuel cell and/or TEGs, can store at least a portion of the electrical energy, and subsequently provides electrical energy to the server computers.

In some embodiments, the amount of power produced by the fuel cells and/or TEGs changes over time and the UPS can receive the different power levels (e.g., wattage) of the produced energy while providing a constant power level to the server computers. In some embodiments, amount of power consumed by the server computers changes over time, and the UPS can provide the appropriate changing power levels to the server computers, irrespective of the amount of power being produced by the fuel cell and/or TEGs at that moment.

Figure 1:
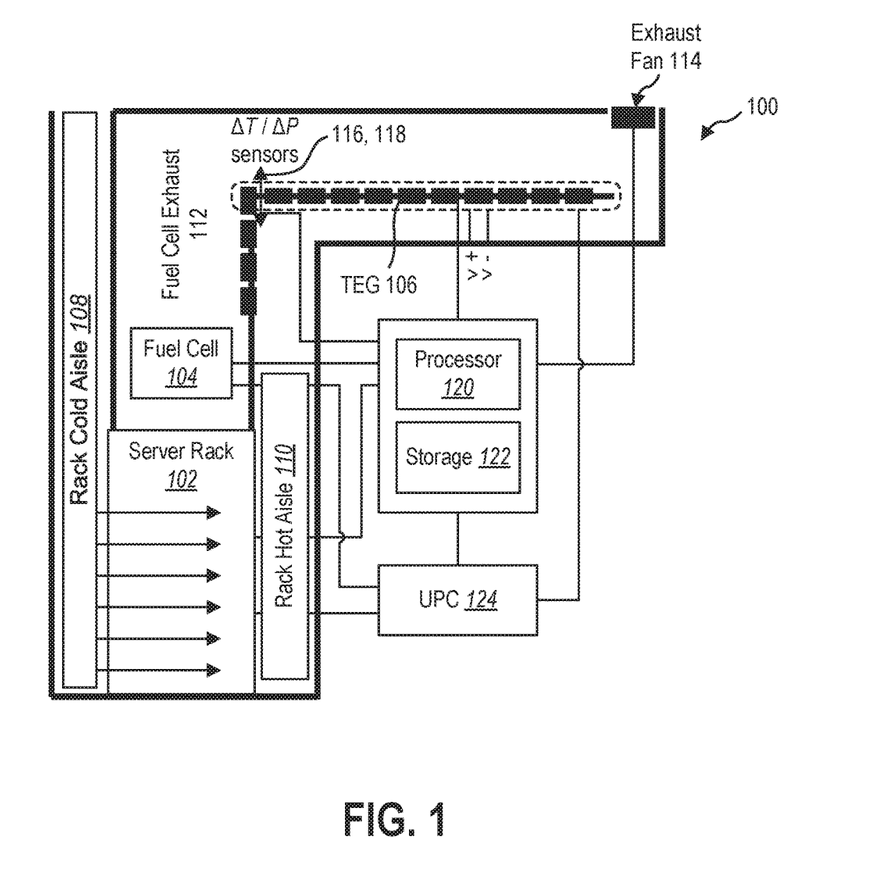
FIG. 1 is a rack-level system diagram of a datacenter, according to at least some embodiments of the present disclosure.

FIG. 1 is a rack-level system diagram of a datacenter, according to some embodiments of the present disclosure. The system 100 includes a server rack 102 with at least one server computer in data communication with a network. The system further includes a fuel cell 104 and at least one thermoelectric generator (TEG) 106. Air flows over a surface of the server rack 102 from a cold aisle 108 to a hot aisle 110, and at least part of the hot aisle 110 is ducted adjacent or proximate to the fuel cell exhaust ducting 112. The TEG 106 is positioned between a portion of the hot aisle 110 and a portion of the fuel cell exhaust ducting 112 such that the TEG 106 experiences a temperature gradient between a hot terminal and a cold terminal that is related to a temperature delta between the warm air of the hot aisle and the fuel cell exhaust gases. The flowrate of the hot aisle air and/or the fuel cell exhaust is controlled by an exhaust fan 114 in fluid communication with the hot aisle 110 and the fuel cell exhaust ducting 112. In some embodiments, an exhaust fan 114 pulls the warm air through the hot aisle 110. In some embodiments, an exhaust fan 114 pulls exhaust gases through the fuel cell exhaust ducting 112. In some embodiments, a first exhaust fan pulls the warm air through the hot aisle 110 and a second exhaust fan pulls exhaust gases through the fuel cell exhaust ducting 112. In some embodiments, the exhaust fan 114 includes a damper that further regulates airflow by opening or closing to permit or restrict the flowrate. In at least one embodiment, both the hot aisle 110 and the fuel cell exhaust ducting 112 each have an exhaust fan 114 and a damper that are independently controllable to adjust the temperature and pressure in the hot aisle 110 and the fuel cell exhaust ducting 112, respectively.

In some embodiments, the system 100 includes at least one temperature delta sensor 116 and at least one pressure delta sensor 118. In some examples, the temperature delta sensor 116 and pressure delta sensor 118 may be located near the start of the hot aisle 110 and/or fuel cell exhaust ducting 112 (e.g., proximate the server rack 102 and fuel cell 104) to approximate a temperature and pressure delta at the energy producing and consuming components. In some examples, the temperature delta sensor 116 and pressure delta sensor 118 may be located near the end of the hot aisle 110 and/or fuel cell exhaust ducting 112 (e.g., distal from the server rack 102 and fuel cell 104). In some examples, the temperature delta sensor 116 and pressure delta sensor 118 may be located near the center of the hot aisle 110 and/or fuel cell exhaust ducting 112 to approximate an average temperature and pressure delta. In some examples, the temperature delta sensor 116 and pressure delta sensor 118 may be located near one or more TEGs 106 to approximate the temperature and pressure delta experienced by the TEG 106. In at least one embodiment, the system 100 includes a plurality of temperature delta sensors 116 and pressure delta sensors 118 located at different locations along the length of the hot aisle 110 and/or fuel cell exhaust ducting 112.

Increased VM allocations or higher VM utilization can consume more power and require greater power production from the fuel cell and/or TEGs. Increased fuel cell operation can produce greater exhaust temperatures, which, in some embodiments, can generate a larger temperature delta across the TEGs and saturate the TEGs, reducing efficiency of the TEGs. In some embodiments, increasing the VM allocations to a server computer results in more demand on the server computer processing capacity, reducing performance for the users allocated to the server computer. However, reducing VM allocations, and hence power requirements of the server computer, can result in wasted energy production from the fuel cell and TEGs. In some embodiments, reducing the operating rate of the fuel cell can reduce the efficiency of the fuel cell.

In some embodiments, a processor in data communication with the server computer(s) can receive information about the system and allocate VM placements based on one or more properties of the system. The processor can optimize one or more of the fuel cell efficiency, the TEG efficiency, the server usage, the server temperature, or combinations thereof. In some embodiments, the processor can allocate VM placements to optimize the fuel cell efficiency, the TEG efficiency, the server usage, the server temperature, or combinations thereof. In other embodiments, the processor can control the VM allocations, the fuel cell operating rate, an exhaust fan speed, or other elements of the system to optimize the fuel cell efficiency, the TEG efficiency, the server usage, the server temperature, or combinations thereof. In at least one embodiment, the processor is in data communication with a plurality of systems (each including a server rack, an associated fuel cell, plurality of TEGs, UPS, hot aisle, etc.) and allocate VM placements between the systems.

In some embodiments, the processor is further in data communication with a hardware storage device. The hardware storage device has instructions stored thereon that, when executed by the processor, cause the processor to perform any of the methods described herein. In some embodiments, the hardware storage device is a non-transient storage device including any of RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

In some embodiments, a processor 120 allocates VM placements on the server rack 102 by receiving real-time telemetry from components of the system 100. For example, the processor 120 may be in data communication with the server rack 102, the fuel cell 104, the TEG(s) 106, the exhaust fan 114 and/or dampers, the temperature delta sensor(s) 116 and pressure delta sensor(s) 118, or combinations thereof to receive information regarding the measurements and/or operation of the components. The processor 120 is further in data communication with a hardware storage device 122. In some embodiments, the energy produced by the fuel cell 104 and the TEGs 106 is provided to the UPS 124 to store the energy and provide the energy to the server rack 102 as demanded.

In some embodiments a TEG includes a hot terminal and a cold terminal with thermoelectric semiconductor materials positioned therebetween. Thermoelectric materials generate power directly from the heat by converting temperature differences into electric voltage. Typically, thermoelectric materials have high electrical conductivity ($\sigma$) and low thermal conductivity ($\kappa$). A low thermal conductivity allows the hot terminal to remain hot relative to the cold terminal and maintain the thermal gradient. A larger thermal gradient generates a larger electric potential between the hot terminal and the cold terminal. The magnitude of the thermoelectric response to the temperature delta across the material is given by the Seebeck coefficient (S) in Volts per Kelvin.

Figure 2:
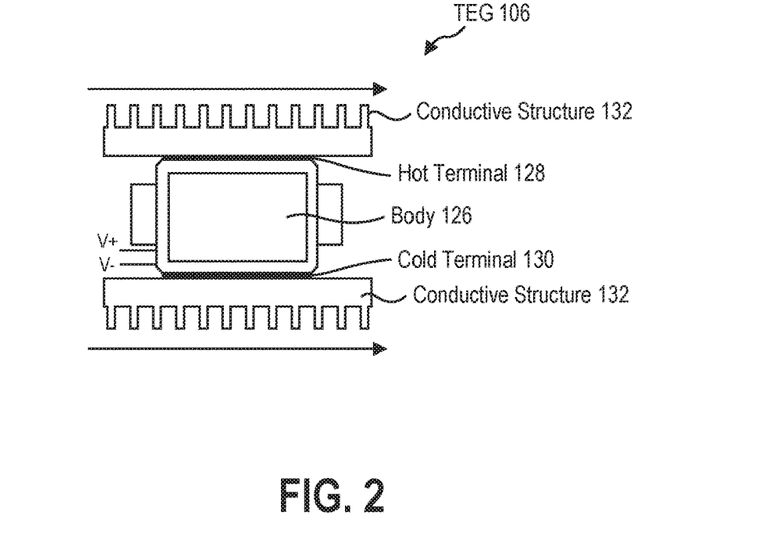
FIG. 2 is a side view of a thermoelectric generator, according to at least some embodiments of the present disclosure.

FIG. 2 illustrates a TEG 106, according to some embodiments of the present disclosure. In some embodiments, the TEG 106 includes Bismuth telluride, Silicon germanium, Lead telluride, or combinations thereof positioned in a body 126 between the hot terminal 128 and the cold terminal 130. TEGs may be arranged in series or in parallel or combinations thereof to achieve higher voltage or current. In some embodiments, TEGs are in grid designs, such as a "staircase" pattern (also known as the series-parallel arrangement). Grid designs allow the creation of scalable forms. Different thermoelectric materials can exhibit different efficiencies at different temperature deltas. In embodiments with TEGs including different thermoelectric materials in the body 126 (or different sizes of body), the TEG efficiency target value is different for the different TEGs. For example, the temperature delta may vary along the length of the hot aisle and fuel exhaust ducting, and different TEGs can be positioned on the length to match the changes in the temperature delta. In some embodiments, the TEG efficiency target value is an average value of the TEGs used in the system. In some embodiments, TEG efficiency target value is a plurality of values based on the TEGs and positions at which the TEGs are used in the system.

In some embodiments, the TEG 106 includes conductive structures 132, such as fins, grooves, pins, towers, gratings, or other structures to increase surface area across which a fluid can flow. For example, to maintain the thermal gradient (e.g., the temperature delta) between the hot terminal 128 and the cold terminal 130, the hot terminal 128 receives thermal energy from the fuel cell exhaust and the cold terminal 130 dissipates thermal energy to the warm (but relatively cold) air of the hot aisle. While the body 126 of the TEG 106 has relatively low thermal conductivity and thermally insulates the hot terminal 128 from the cold terminal 130, over time, the gradient decreases and the TEG 106 maintains the thermal gradient through thermal energy flow from and to the gases on either side.

Figure 3:
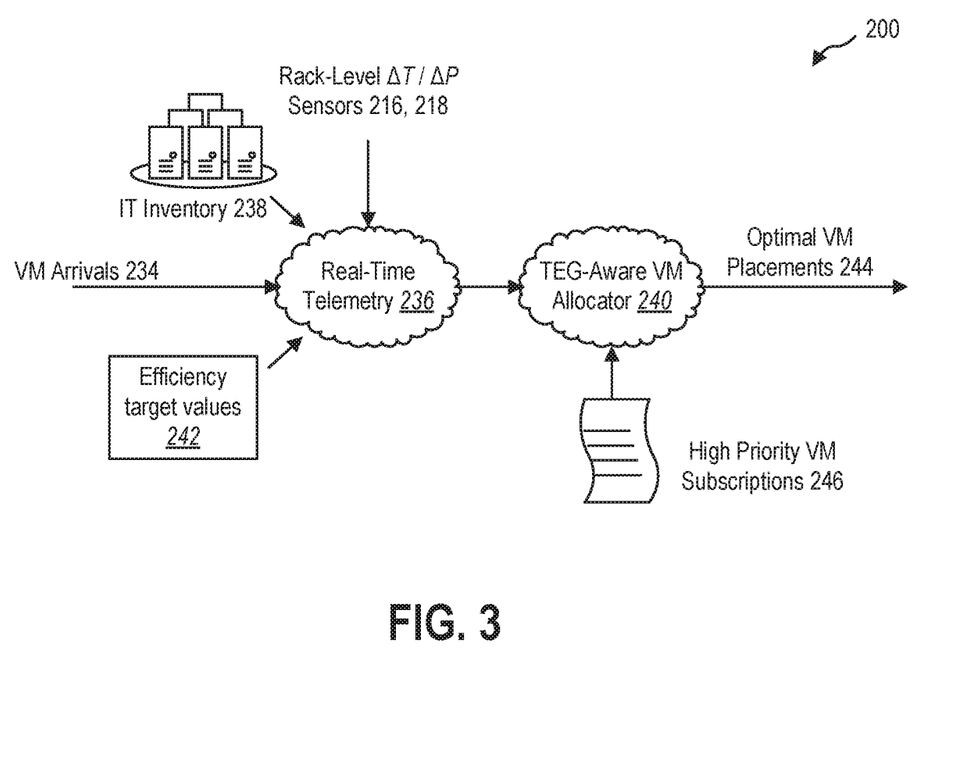
FIG. 3 is a system flowchart of a datacenter, according to at least some embodiments of the present disclosure.

FIG. 3 is a system flowchart diagram, according to some embodiments of the present disclosure. A system 200 according to the present disclosure can receive virtual machine allocation requests 234 from a network connection and evaluate the conditions of the system through real-time telemetry 236. For example, the real-time telemetry 236 may include temperature sensors 216 and/or pressure sensors 218 that measure or calculate a temperature delta and/or pressure delta between the fuel cell exhaust and the hot aisle. In some examples, the real-time telemetry 236 may include fuel cell operating rates. In some examples, the real-time telemetry 236 may include server usage rates.

The system 200 includes an IT inventory 238 that maps different server computers and/or server racks to fuel cells so the VM Allocator 240 of the system 200 (e.g., the processor described above) is aware of which server computers are powered by which fuel cells. The VM Allocator 240 can receive the real-time telemetry 236, the IT inventory map 238, and efficiency target values 242 for the different components of the system to determine VM assignments 244 to optimize performance.

In some embodiments, the efficiency target values 242 include a fuel cell efficiency target value. For example, a fuel cell may exhibit higher efficiency in energy production when operating at a particular percentage of the operating capacity. In some embodiments, the fuel cell efficiency target value is a particular value, such as 80% of the maximum operating capacity of the fuel cell. In other embodiments, the fuel cell efficiency target value is a range of values in which the peak efficiency is attained, such as any operating rate greater than 80% of the maximum operating capacity of the fuel cell.

In some embodiments, the efficiency target values include a thermoelectric generator efficiency target value. For example, a TEG may exhibit higher efficiency in energy production when operating at a particular temperature delta. In some embodiments, the fuel cell efficiency target value is a particular value, such as a temperature delta of 200° C. In other embodiments, the thermoelectric generator efficiency target value is a range of values in which the peak efficiency is attained, such as exhibiting equal efficiency at any temperature delta greater than 100° C.

In some embodiments, the efficiency target values include a server user capacity percentage target value. For example, a server computer or server rack may operate most efficiently when all processors are utilized without the system running out of processing capacity. For example, if each VM allocated to a processor of the server computer uses 25% of the processing capacity, three VMs can utilize 75% of the processing capacity leaving additional capacity for temporary increases in processing demands and leaving relatively little unused processing capacity. In some embodiments, the server user capacity percentage target value is a particular value, such as 75% processor usage. In other embodiments, the server user capacity percentage target value is a range of values in which the peak VM processing performance is attained, such as any server user percentage between 50% and 75%.

In some embodiments, the VM Allocator 240 further receives a list of high priority VM subscriptions 246 to prioritize placement of particular VM subscriptions to ensure high computing performance. In at least one example, the high priority VM subscriptions 246 can alter the server user capacity percentage target value for a server computer or server rack to ensure the high priority VM subscriptions 246 can receive a greater apportionment of the available processing capacity to ensure VM performance.

The VM Allocator 240 can assign VM placements based on the real-time telemetry 236 relative to the efficiency target values 242 described herein or other target values.

Figure 4:
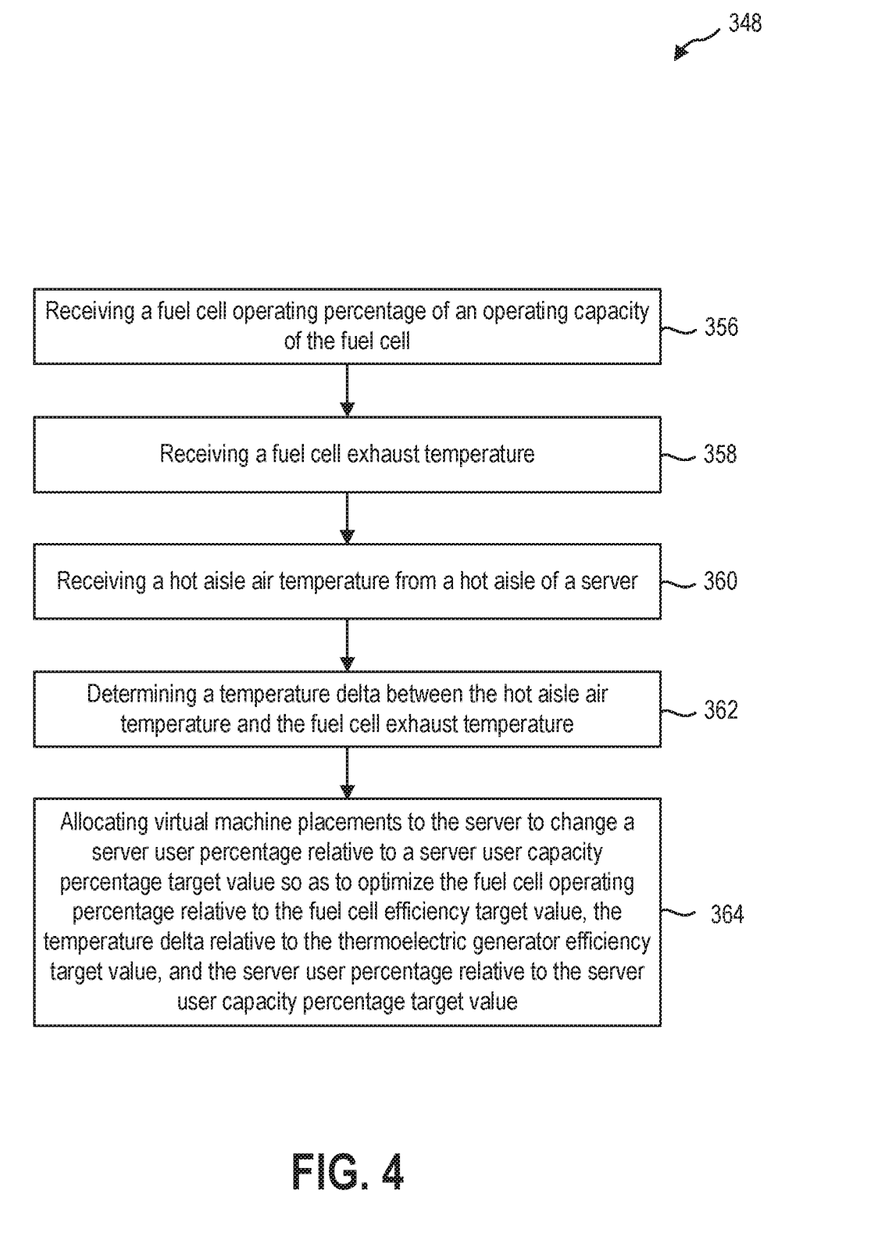
FIG. 4 is a flowchart illustrating a method of controlling energy in a datacenter, according to at least some embodiments of the present disclosure.

Referring now to FIG. 4, in some embodiments, a method 348 of controlling energy in a datacenter includes obtaining a fuel cell efficiency target value, obtaining a thermoelectric generator efficiency target value, and obtaining a server use capacity percentage target value. In some embodiments, these values are obtained from a local hardware storage device. In some embodiments, these values are obtained from a remote or transportable storage device, such as via a network or removable media. These values allow the system to have target values, which the system can attempt to approach.

In some embodiments, the method further includes receiving information about the current state of the system (e.g., real-time telemetry) including receiving (356) a fuel cell operating percentage of an operating capacity of the fuel cell, receiving (358) a fuel cell exhaust temperature, and receiving (360) a hot aisle air temperature from a hot aisle of the server computer and/or server rack. From the fuel cell exhaust temperature and the hot aisle air temperature, the method further includes determining (362) a temperature delta between the hot aisle air temperature and the fuel cell exhaust temperature to define the thermal gradient across the TEG. In some embodiments, the method includes receiving an air pressure in the hot aisle and a fuel cell exhaust pressure. A high gas pressure adjacent a terminal of the TEG can provide a greater convective thermal transfer. Therefore, the rate of thermal energy transfer to the hot terminal of the TEG and/or from the cold terminal of the TEG is related to the gas pressure and gas temperature adjacent the TEG.

In some embodiments, determining the temperature delta is performed for the position of the first TEG in the system. For example, the first TEG is the TEG nearest the fuel cell and the server computer(s) that experiences the largest temperature delta. In some embodiments, determining the temperature delta is performed for the position of an average TEG in the system. For example, the position of the average TEG may be the center of a plurality of TEGs. As the fuel cell exhaust flows through the ducting and past a plurality of TEGs, the fuel cell exhaust may decrease in temperature. In some examples, as the hot aisle air flows through the ducting and past a plurality of TEGs, the hot aisle air may decrease in temperature toward ambient temperature. In other examples, as the hot aisle air flows through the ducting and past a plurality of TEGs, the hot aisle air may increase in temperature as the hot aisle air receives thermal energy dissipating from the cold terminals of the TEGs (e.g., thermal energy from the fuel cell exhaust absorbed by the TEGs at the hot terminal). In some embodiments, determining the temperature delta is performed for a plurality of positions along a plurality of TEGs in the system. For example, the temperature delta may vary depending on position in an array of TEGs and along the ducting of the fuel cell exhaust and the hot aisle. In such embodiments, the method includes receiving fuel cell exhaust temperatures from a plurality of locations and receiving hot aisle air temperatures from a plurality of locations.

In some embodiments, the method includes allocating (364) virtual machine placements to the server computer or server rack to change a server user percentage relative to a server user capacity percentage target value so as to optimize the fuel cell operating percentage relative to the fuel cell efficiency target value, the temperature delta relative to the thermoelectric generator efficiency target value, and the server user percentage relative to the server user capacity percentage target value.

In some embodiments, optimizing the fuel cell operating percentage relative to the fuel cell efficiency target value, the temperature delta relative to the thermoelectric generator efficiency target value, and the server user percentage relative to the server user capacity percentage target value includes calculating a three-dimensional Pareto frontier. For example, the Pareto frontier defines the boundary at which reallocation of resources does not result in an improvement in one category without an associated degradation in another category. In some embodiments, the variables in the described system are related. For example, increasing the server user percentage requires greater energy consumption from the server computer(s), which requires an increase in the operating percentage of the fuel cell, which produces a higher fuel cell exhaust temperature. However, the increase in server user percentage also produces an associated increase in server temperature and therefore an increase in hot aisle air temperature.

A calculation of a three-dimensional Pareto frontier can identify an optimal resource allocation based on the multi-variable system with interrelated properties. In some embodiments, however, one or more of the variables is prioritized over others. In some examples, the fuel cell efficiency may be prioritized as the fuel cell is the primary source of energy for the datacenter and efficient production of energy from the fuel cell is economically most important. In some examples, the server user percentage is prioritized as processing performance and user experience is most important to the datacenter operations. In some examples, the TEGs efficiency is prioritized as the temperature delta may be altered without significant impact to the user experience of the VMs placed in the server computer.

In some embodiments, the Pareto frontier is used to determine when the system is "optimized." In some embodiments, greater flexibility and adaptability are provided by considering a variable "optimized" when a measured value is within a preset range of the respective target value. In some examples, the fuel cell efficiency target value is 80% and the fuel cell operating percentage is considered optimized when the fuel cell operating percentage is within 10% of the fuel cell efficiency target value (e.g., 72% to 88%). In some examples, the thermoelectric generator efficiency target value is a temperature delta of 200° C. and the temperature delta is considered optimized when the temperature delta is within 25% of the thermoelectric generator efficiency target value (e.g., 150° C. to 250° C.).

In some embodiments, the optimized buffer for the target value may be unequal on the high end and on the low end. In some examples, the thermoelectric generator efficiency target value is a temperature delta of 200° C. and the temperature delta is considered optimized when the temperature delta is within 25% of the thermoelectric generator efficiency target value on the low end and 10% on the high end (e.g., 150° C. to 220° C.). In some examples, the server user capacity percentage target value is 75% and the server user percentage is considered optimized when the server user percentage is within 33% of the server user capacity percentage target value on the low end and within 10% on the high end (e.g., 50% to 82.5% of the server user capacity).

Figure 5:
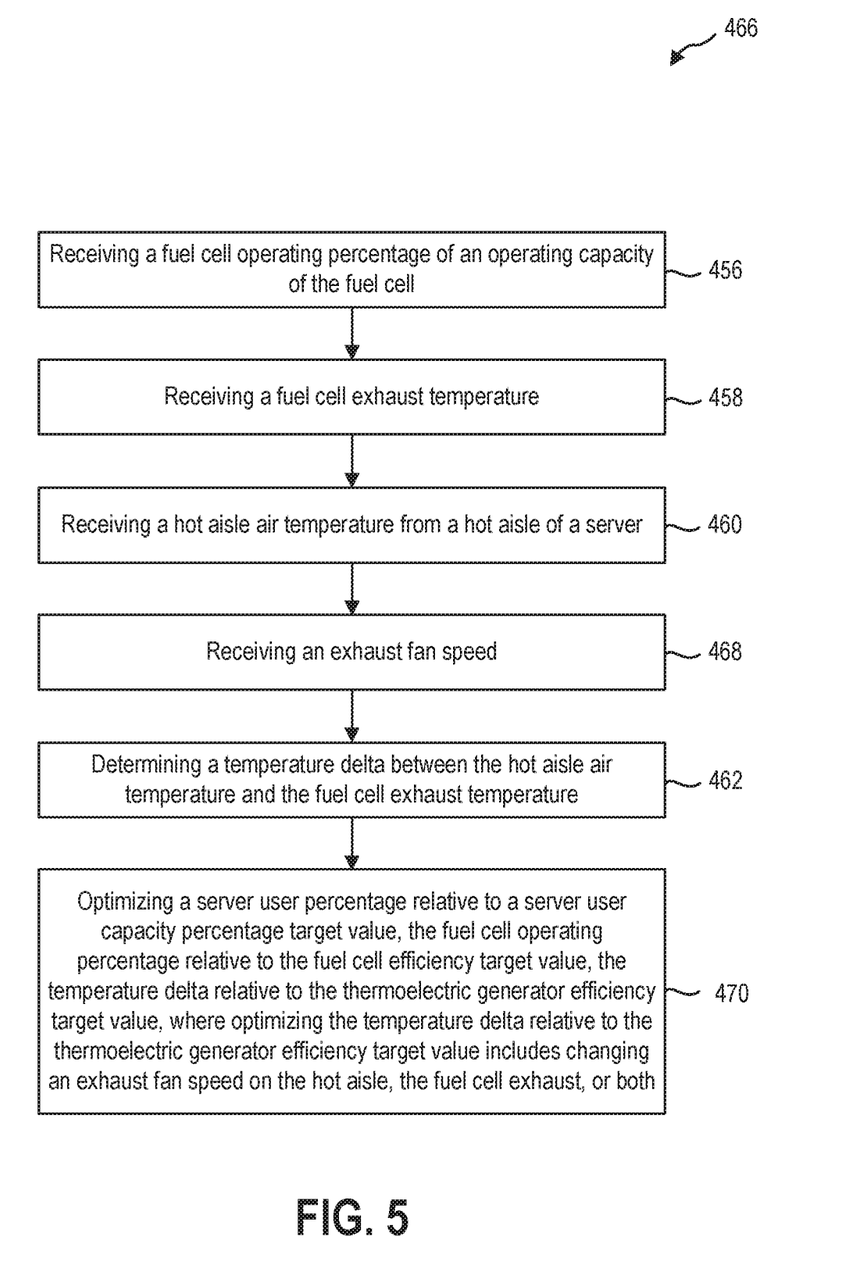
FIG. 5 is a flowchart illustrating another method of controlling energy in a datacenter, according to at least some embodiments of the present disclosure.

FIG. 5 is a flowchart illustrating another method 466, according to some embodiments of the present disclosure. In some embodiments, a method 466 of controlling energy in a datacenter includes further controlling the air flow through the hot aisle and/or the fuel cell exhaust ducting to further control the temperatures of the exhausted gases. The method includes obtaining a fuel cell efficiency target value, obtaining a thermoelectric generator efficiency target value, and obtaining a server use capacity percentage target value as described herein.

The method further includes receiving information about the current state of the system (e.g., real-time telemetry) including receiving (456) a fuel cell operating percentage of an operating capacity of the fuel cell, receiving (458) a fuel cell exhaust temperature, receiving (460) a hot aisle air temperature from a hot aisle of the server computer and/or server rack, and receiving (468) an exhaust fan speed. From the fuel cell exhaust temperature and the hot aisle air temperature, the method further includes determining (462) a temperature delta between the hot aisle air temperature and the fuel cell exhaust temperature to define the thermal gradient across the TEG. In some embodiments, the method further comprises receiving a fuel cell exhaust pressure and receiving a hot aisle air pressure from a hot aisle of the server computer and/or server rack. From the fuel cell exhaust temperature and the hot aisle air temperature, the method may further include determining a temperature delta between the hot aisle air temperature and the fuel cell exhaust temperature to define the thermal gradient across the TEG.

In some embodiments, the exhaust fan speed can affect the hot aisle air temperature, the fuel cell exhaust temperature, the hot aisle air pressure, the fuel cell exhaust pressure, or combinations thereof. For example, an exhaust fan may draw air through the hot aisle and a higher exhaust fan speed may relate to a reduced hot aisle air temperature and hot aisle air pressure at the TEGs. In some examples, an exhaust fan may draw fuel cell exhaust through the fuel cell exhaust ducting and a higher exhaust fan speed may relate to a reduced fuel cell exhaust temperature and fuel cell exhaust pressure at the TEGs. Changing the gas pressure and/or temperature adjacent the TEGs can affect the rate of thermal energy transfer between the gas and the hot and/or cold terminals.

After receiving the real-time telemetry of the systems, the method includes optimizing (470) a server user percentage relative to a server user capacity percentage target value, the fuel cell operating percentage relative to the fuel cell efficiency target value, the temperature delta relative to the thermoelectric generator efficiency target value, and the server user capacity percentage target value, where optimizing the temperature delta relative to the thermoelectric generator efficiency target value includes changing an exhaust fan speed on the hot aisle, the fuel cell exhaust, or both.

In some embodiments, optimizing the server user percentage relative to a server user capacity percentage target value, the fuel cell operating percentage relative to the fuel cell efficiency target value, the temperature delta relative to the thermoelectric generator efficiency target value, and the server user capacity percentage target value includes calculating a Pareto frontier. In some embodiments, optimizing the different property values includes attaining or approaching the target values. In some embodiments, optimizing the different property values includes maintaining the property values in a preset range of the target values.

In at least one embodiment, a method or system according to the present disclosure optimizes the efficiency of a datacenter by balancing the efficiency of energy production by fuel cells and TEGs with the efficiency of energy consumption by the server computer(s). By allocating VM placements to control the level of energy consumption of the server computer(s), the methods described herein can maintain efficient use of the server processing capacity while producing commensurate energy from the fuel cells and TEGs at or near a peak efficiency of the power sources.

INDUSTRIAL APPLICABILITY

The present disclosure relates generally to systems and methods for controlling energy in a datacenter. In some embodiments, the present disclosure describes systems and methods for controlling production and/or consumption of energy in a datacenter. For example, the datacenter includes a plurality of server computers arranged in server racks that consume electrical energy. The electricity may be generated locally (e.g., in a building local to the datacenter building, in the datacenter building, in the room with the server rack) and used to power the server rack. In some embodiments, the generation of the energy produces waste heat. The waste heat can be harvested to provide further electrical energy.

In some embodiments, a system according to the present disclosure includes a server computer and a fuel cell to power the server computer. In some embodiments, the server computer is one of a plurality of server computers arranged in a server rack. The server rack may have 1, 2, 3, 4, 5, 6, 7, 8 or more server computers. In some embodiments, a system according to the present disclosure includes a plurality of server racks. The server computer receives virtual machine (VM) allocations to provide computational services and/or data storage to a plurality of users connected to the server computer via a network connection. Generally, a greater quantity of VM allocations consumes a larger amount of energy from the fuel cell.

In some embodiments, the fuel cell is a solid-oxide fuel cell. In some embodiments, the fuel cell is a hydrogen fuel cell. In some embodiments, the fuel cell is a solid acid fuel cell. In some embodiments, the fuel cell is a carbonate fuel cell. The fuel cell produces electricity through a controlled chemical reaction in the fuel cell, which also produces thermal energy. The fuel cell may have an operating temperature greater than 300° C. In some embodiments, the fuel cell produces exhaust gases with an exhaust gas temperature greater than 300° C. The fuel cell exhaust, therefore, has thermal energy, which can further be harvested to generate electrical energy.

The server computer generates thermal energy during operation that is removed from the server computer and server rack by a flow of air through and/or over the server rack. Incoming air arrives at the server rack via a cold aisle and is directed through and/or over the server rack. The air absorbs thermal energy from the server rack through thermal convection, conduction, and radiation and exits the server rack with a portion of the thermal energy of the server computers therein. The warm air flows away from the server rack in a hot aisle of the ducting and flows toward an exhaust fan.

In some embodiments, the fuel cell exhaust and the hot aisle removing thermal energy from the server rack have a temperature difference or temperature delta that is 50° C., 75° C., 100° C., 125° C., 150° C., 200° C., 250° C., 300° C., or greater. The datacenter may position the ducting of the hot aisle and the ducting of the fuel cell exhaust proximate and/or adjacent to one another. In some embodiments, one or more thermoelectric generators (TEGs) are positioned between the fuel cell exhaust and the hot aisle. The have a hot terminal positioned in thermal communication with the fuel cell exhaust and a cold terminal in thermal communication with the warm air of the hot aisle. The resulting thermal gradient across the TEGs produces an electrical potential and associated current.

The electrical energy produced by the fuel cell(s) and the TEG(s) may be provided to the server computer(s) to power the server computer(s). In some examples, the fuel cell and the TEGs are directly connected to the server computers to power the server computers. In other examples, the system includes an uninterruptable power supply (UPS) or other energy storage device that receives electrical energy from the fuel cell and/or TEGs, can store at least a portion of the electrical energy, and subsequently provides electrical energy to the server computers.

In some embodiments, the amount of power produced by the fuel cells and/or TEGs changes over time and the UPS can receive the different power levels (e.g., wattage) of the produced energy while providing a constant power level to the server computers. In some embodiments, amount of power consumed by the server computers changes over time, and the UPS can provide the appropriate changing power levels to the server computers, irrespective of the amount of power being produced by the fuel cell and/or TEGs at that moment.

Increased VM allocations can consume more power and require greater power production from the fuel cell and/or TEGs. Increased fuel cell operation can produce greater exhaust temperatures, which, in some embodiments, can generate a larger temperature delta across the TEGs and saturate the TEGs, reducing efficiency of the TEGs. In some embodiments, increasing the VM allocations to a server computer results in more demand on the server computer processing capacity, reducing performance for the users allocated to the server computer. However, reducing VM allocations, and hence power requirements of the server computer, can result in wasted energy production from the fuel cell and TEGs. In some embodiments, reducing the operating rate of the fuel cell can reduce the efficiency of the fuel cell.

In some embodiments, a processor in data communication with the server computer(s) can receive information about the system and allocate VM placements based on one or more properties of the system. The processor can optimize one or more of the fuel cell efficiency, the TEG efficiency, the server usage, the server temperature, or combinations thereof. In some embodiments, the processor can allocate VM placements to optimize the fuel cell efficiency, the TEG efficiency, the server usage, the server temperature, or combinations thereof. In other embodiments, the processor can control the VM allocations, the fuel cell operating rate, an exhaust fan speed, or other elements of the system to optimize the fuel cell efficiency, the TEG efficiency, the server usage, the server temperature, or combinations thereof. In at least one embodiment, the processor is in data communication with a plurality of systems (each including a server rack, an associated fuel cell, plurality of TEGs, UPS, hot aisle, etc.) and allocate VM placements between the systems.

In some embodiments, the processor is further in data communication with a hardware storage device. The hardware storage device has instructions stored thereon that, when executed by the processor, cause the processor to perform any of the methods described herein. In some embodiments, the hardware storage device is a non-transient storage device including any of RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

In some embodiments a TEG includes a hot terminal and a cold terminal with thermoelectric semiconductor materials positioned therebetween. Thermoelectric materials generate power directly from the heat by converting temperature differences into electric voltage. Typically, thermoelectric materials have high electrical conductivity ($\sigma$) and low thermal conductivity ($\kappa$). A low thermal conductivity allows the hot terminal to remain hot relative to the cold terminal and maintain the thermal gradient. A larger thermal gradient generates a larger electric potential between the hot terminal and the cold terminal. The magnitude of the thermoelectric response to the temperature delta across the material is given by the Seebeck coefficient (S) in Volts per Kelvin.

In some embodiments, the TEG includes Bismuth telluride, Silicon germanium, lead telluride, or combinations thereof. TEGs may be arranged in series or in parallel or combinations thereof to achieve higher voltage or current. In some embodiments, TEGs are in grid designs, such as a "staircase" pattern (also known as the series-parallel arrangement). Grid designs all ow the creation of scalable forms.

In some embodiments, the TEGS include conductive structures, such as fins, grooves, pins, towers, gratings, or other structures to increase surface area across which a fluid can flow. For example, to maintain the thermal gradient (e.g., the temperature delta) between the hot terminal and the cold terminal, the hot terminal receives thermal energy from the fuel cell exhaust and the cold terminal dissipates thermal energy to the warm (but relatively cold) air of the hot aisle. While the TEG has relatively low thermal conductively and thermally insulates the hot terminal from the cold terminal, over time, the gradient decreases and the TEG maintains the thermal gradient through thermal energy flow from and to the gases on either side.

A system according to the present disclosure can receive virtual machine allocation requests from a network connection and evaluate the conditions of the system through real-time telemetry. For example, the real-time telemetry may include temperature sensors and/or pressure sensors that measure or calculate a temperature delta and/or pressure delta between the fuel cell exhaust and the hot aisle. In some examples, the real-time telemetry may include fuel cell operating rates. In some examples, the real-time telemetry may include server usage rates.

The system includes an IT inventory that maps different server computers and/or server racks to fuel cells so the VM Allocator of the system (e.g., the processor described above) is aware of which server computers are powered by which fuel cells. The VM Allocator can receive the real-time telemetry, the IT inventory map, and efficiency target values for the different components of the system to determine VM assignments to optimize performance.

In some embodiments, the efficiency target values include a fuel cell efficiency target value. For example, a fuel cell may exhibit higher efficiency in energy production when operating at a particular percentage of the operating capacity. In some embodiments, the fuel cell efficiency target value is a particular value, such as 80% of the maximum operating capacity of the fuel cell. In other embodiments, the fuel cell efficiency target value is a range of values in which the peak efficiency is attained, such as any operating rate greater than 80% of the maximum operating capacity of the fuel cell.

In some embodiments, the efficiency target values include a thermoelectric generator efficiency target value. For example, a TEG may exhibit higher efficiency in energy production when operating at a particular temperature delta.

In some embodiments, the fuel cell efficiency target value is a particular value, such as a temperature delta of 200° C. In other embodiments, the thermoelectric generator efficiency target value is a range of values in which the peak efficiency is attained, such as exhibiting equal efficiency at any temperature delta greater than 100° C.

In some embodiments, the efficiency target values include a server user capacity percentage target value. For example, a server computer or server rack may operate most efficiently when all processors are utilized without the system running out of processing capacity. For example, if each VM allocated to a processor of the server computer uses 25% of the processing capacity, three VMs can utilize 75% of the processing capacity leaving additional capacity for temporary increases in processing demands and leaving relatively little unused processing capacity. In some embodiments, the server user capacity percentage target value is a particular value, such as 75% processor usage. In other embodiments, the server user capacity percentage target value is a range of values in which the peak VM processing performance is attained, such as any server user percentage between 50% and 75%.

In some embodiments, the VM Allocator further receives a list of high priority VM subscriptions to prioritize placement of particular VM subscriptions to ensure high computing performance. In at least one example, the high priority VM subscriptions can alter the server user capacity percentage target value for a server computer or server rack to ensure the high priority VM subscriptions can receive a greater apportionment of the available processing capacity to ensure VM performance.

The VM Allocator can assign VM placements based on the real-time telemetry relative to the target values described herein or other target values. In some embodiments, a method of controlling energy in a datacenter includes obtaining a fuel cell efficiency target value, obtaining a thermoelectric generator efficiency target value, and obtaining a server use capacity percentage target value. These values allow the system to have target values, which the system can attempt to approach.

In some embodiments, the method further includes receiving information about the current state of the system (e.g., real-time telemetry) including receiving a fuel cell operating percentage of an operating capacity of the fuel cell, receiving a fuel cell exhaust temperature, and receiving a hot aisle air temperature from a hot aisle of the server computer and/or server rack. From the fuel cell exhaust temperature and the hot aisle air temperature, the method further includes determining a temperature delta between the hot aisle air temperature and the fuel cell exhaust temperature to define the thermal gradient across the TEG. In some embodiments, the method includes receiving an air pressure in the hot aisle and a fuel cell exhaust pressure. A high gas pressure adjacent a terminal of the TEG can provide a greater convective thermal transfer. Therefore, the rate of thermal energy transfer to the hot terminal of the TEG and/or from the cold terminal of the TEG is related to the gas pressure and gas temperature adjacent the TEG.

In some embodiments, determining the temperature delta is performed for the position of the first TEG in the system. For example, the first TEG is the TEG nearest the fuel cell and the server computer(s) that experiences the largest temperature delta. In some embodiments, determining the temperature delta is performed for the position of an average TEG in the system. For example, the position of the average TEG may be the center of a plurality of TEGs. As the fuel cell exhaust flows through the ducting and past a plurality of TEGs, the fuel cell exhaust may decrease in temperature. In some examples, as the hot aisle air flows through the ducting and past a plurality of TEGs, the hot aisle air may decrease in temperature toward ambient temperature. In other examples, as the hot aisle air flows through the ducting and past a plurality of TEGs, the hot aisle air may increase in temperature as the hot aisle air receives thermal energy dissipating from the cold terminals of the TEGs (e.g., thermal energy from the fuel cell exhaust absorbed by the TEGs at the hot terminal). In some embodiments, determining the temperature delta is performed for a plurality of positions along a plurality of TEGs in the system. For example, the temperature delta may vary depending on position in an array of TEGs and along the ducting of the fuel cell exhaust and the hot aisle. In such embodiments, the method includes receiving fuel cell exhaust temperatures from a plurality of locations and receiving hot aisle air temperatures from a plurality of locations.

In some embodiments, the method includes allocating virtual machine placements to the server computer or server rack to change a server user percentage relative to a server user capacity percentage target value so as to optimize the fuel cell operating percentage relative to the fuel cell efficiency target value, the temperature delta relative to the thermoelectric generator efficiency target value, and the server user percentage relative to the server user capacity percentage target value.

In some embodiments, optimizing the fuel cell operating percentage relative to the fuel cell efficiency target value, the temperature delta relative to the thermoelectric generator efficiency target value, and the server user percentage relative to the server user capacity percentage target value includes calculating a three-dimensional Pareto frontier. For example, the Pareto frontier defines the boundary at which reallocation of resources does not result in an improvement in one category without an associated degradation in another category. In some embodiments, the variables in the described system are related. For example, increasing the server user percentage requires greater energy consumption from the server computer(s), which requires an increase in the operating percentage of the fuel cell, which produces a higher fuel cell exhaust temperature. However, the increase in server user percentage also produces an associated increase in server temperature and therefore an increase in hot aisle air temperature.

A calculation of a three-dimensional Pareto frontier can identify an optimal resource allocation based on the multi-variable system with interrelated properties. In some embodiments, however, one or more of the variables is prioritized over others. In some examples, the fuel cell efficiency may be prioritized as the fuel cell is the primary source of energy for the datacenter and efficient production of energy from the fuel cell is economically most important. In some examples, the server user percentage is prioritized as processing performance and user experience is most important to the datacenter operations. In some examples, the TEGs efficiency is prioritized as the temperature delta may be altered without significant impact to the user experience of the VMs placed in the server computer.

In some embodiments, the Pareto frontier is used to determine when the system is "optimized." In some embodiments, greater flexibility and adaptability are provided by considering a variable "optimized" when a measured value is within a preset range of the respective target value. In some examples, the fuel cell efficiency target value is 80% and the fuel cell operating percentage is considered optimized when the fuel cell operating percentage is within 10% of the fuel cell efficiency target value (e.g., 72% to 88%). In some examples, the thermoelectric generator efficiency target value is a temperature delta of 200° C. and the temperature delta is considered optimized when the temperature delta is within 25% of the thermoelectric generator efficiency target value (e.g., 150° C. to 250° C.).

In some embodiments, the optimized buffer for the target value may be unequal on the high end and on the low end. In some examples, the thermoelectric generator efficiency target value is a temperature delta of 200° C. and the temperature delta is considered optimized when the temperature delta is within 25% of the thermoelectric generator efficiency target value on the low end and 10% on the high end (e.g., 150° C. to 220° C.). In some examples, the server user capacity percentage target value is 75% and the server user percentage is considered optimized when the server user percentage is within 33% of the server user capacity percentage target value on the low end and within 10% on the high end (e.g., 50% to 82.5% of the server user capacity).

In some embodiments, a method of controlling energy in a datacenter includes further controlling the air flow through the hot aisle and/or the fuel cell exhaust ducting to further control the temperatures of the exhausted gases. The method includes obtaining a fuel cell efficiency target value, obtaining a thermoelectric generator efficiency target value, and obtaining a server use capacity percentage target value as described herein.

The method further includes receiving information about the current state of the system (e.g., real-time telemetry) including receiving a fuel cell operating percentage of an operating capacity of the fuel cell, receiving a fuel cell exhaust temperature, receiving a hot aisle air temperature from a hot aisle of the server computer and/or server rack, and receiving an exhaust fan speed. From the fuel cell exhaust temperature and the hot aisle air temperature, the method further includes determining a temperature delta between the hot aisle air temperature and the fuel cell exhaust temperature to define the thermal gradient across the TEG. In some embodiments, the method further comprises receiving a fuel cell exhaust pressure and receiving a hot aisle air pressure from a hot aisle of the server computer and/or server rack. From the fuel cell exhaust temperature and the hot aisle air temperature, the method may further include determining a temperature delta between the hot aisle air temperature and the fuel cell exhaust temperature to define the thermal gradient across the TEG.

In some embodiments, the exhaust fan speed can affect the hot aisle air temperature, the fuel cell exhaust temperature, the hot aisle air pressure, the fuel cell exhaust pressure, or combinations thereof. For example, an exhaust fan may draw air through the hot aisle and a higher exhaust fan speed may relate to a reduced hot aisle air temperature and hot aisle air pressure at the TEGs. In some examples, an exhaust fan may draw fuel cell exhaust through the fuel cell exhaust ducting and a higher exhaust fan speed may relate to a reduced fuel cell exhaust temperature and fuel cell exhaust pressure at the TEGs. Changing the gas pressure and/or temperature adjacent the TEGs can affect the rate of thermal energy transfer between the gas and the hot and/or cold terminals.

After obtaining the target values and receiving the real-time telemetry of the systems, the method includes optimizing a server user percentage relative to a server user capacity percentage target value, the fuel cell operating percentage relative to the fuel cell efficiency target value, the temperature delta relative to the thermoelectric generator efficiency target value, and the server user capacity percentage target value, where optimizing the temperature delta relative to the thermoelectric generator efficiency target value includes changing an exhaust fan speed on the hot aisle, the fuel cell exhaust, or both.

In some embodiments, optimizing the server user percentage relative to a server user capacity percentage target value, the fuel cell operating percentage relative to the fuel cell efficiency target value, the temperature delta relative to the thermoelectric generator efficiency target value, and the server user capacity percentage target value includes calculating a Pareto frontier. In some embodiments, optimizing the different property values includes attaining or approaching the target values. In some embodiments, optimizing the different property values includes maintaining the property values in a preset range of the target values.

In at least one embodiment, a method or system according to the present disclosure optimizes the efficiency of a datacenter by balancing the efficiency of energy production by fuel cells and TEGs with the efficiency of energy consumption by the server computer(s). By allocating VM placements to control the level of energy consumption of the server computer(s), the methods described herein can maintain efficient use of the server processing capacity while producing commensurate energy from the fuel cells and TEGs at or near a peak efficiency of the power sources.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: hardware computer-readable storage media and transmission computer-readable media.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry or desired program code means in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

The present disclosure relates to systems and methods for providing motion-adaptive blur filtering according to at least the examples provided in the sections below:

1. A method of controlling energy in a datacenter, the method comprising: receiving a fuel cell operating percentage of an operating capacity of the fuel cell; receiving a fuel cell exhaust temperature; receiving a hot aisle air temperature from a hot aisle of a server computer; determining a temperature delta between the hot aisle air temperature and the fuel cell exhaust temperature; and allocating virtual machine placements to the server computer to change a server user percentage relative to a server user capacity percentage target value so as to optimize the fuel cell operating percentage relative to a fuel cell efficiency target value, the temperature delta relative to a thermoelectric generator efficiency target value, and the server user percentage relative to a server user capacity percentage target value.
2. The method of section 1, wherein the fuel cell operating percentage relative to the fuel cell efficiency target value is prioritized over the temperature delta relative to the thermoelectric generator efficiency target value and the server user percentage relative to the server user capacity percentage target value.
3. The method of section 1, wherein the temperature delta relative to the thermoelectric generator efficiency target value is prioritized over the fuel cell operating percentage relative to the fuel cell efficiency target value and the server user percentage relative to the server user capacity percentage target value.
4. The method of section 1, wherein the server user percentage relative to the server user capacity percentage target value is prioritized over the temperature delta relative to the thermoelectric generator efficiency target value and the fuel cell operating percentage relative to the fuel cell efficiency target value.
5. The method of any of the preceding sections, wherein the fuel cell efficiency target value is between 70% and 90%.
6. The method of any of the preceding sections, wherein the thermoelectric generator efficiency target value is an average thermoelectric generator efficiency target value for a plurality of thermoelectric generators.
7. The method of any of sections 1-5, wherein the thermoelectric generator efficiency target value is a plurality of thermoelectric generator efficiency target values for a plurality of thermoelectric generators along a length of the hot aisle.
8. The method of any of the preceding sections, wherein the server user capacity percentage target value is between 50% and 90%.
9. The method of any of the preceding sections, wherein at least one of the fuel cell efficiency target value, thermoelectric generator efficiency target value, and server user capacity percentage target value is a range of values.
10. The method of any of the preceding sections, wherein optimizing at least one of the fuel cell efficiency target value, thermoelectric generator efficiency target value, and server user capacity percentage target value is a range of values that includes a measured value being within a preset optimized range of the fuel cell efficiency target value, thermoelectric generator efficiency target value, and server user capacity percentage target value.
11. A system for controlling energy consumption in a datacenter, the system comprising:
    a server computer;
    a hot aisle configured to remove heat from the server computer;
    a fuel cell in electrical communication with the server computer;
    a fuel cell exhaust configured to remove heat from the fuel cell;
    a thermoelectric generator positioned between the hot aisle and the fuel cell exhaust; and
    a processor in data communication with at least the server computer; and
    a hardware storage device in data communication with the processor, the hardware storage device having instructions stored thereon that, when executed by the processor cause the processor to:
      allocate virtual machine placements to the server computer based to optimize the fuel cell operating percentage relative to the fuel cell efficiency target value, the temperature delta relative to the thermoelectric generator efficiency target value and the server user capacity percentage target value.
12. The system of section 11 further comprising an exhaust fan to draw air through the hot aisle.
13. The system of sections 11 or 12 further comprising a damper to restrict air flow through the hot aisle.
14. The system of any of sections 11-13, wherein the fuel cell is a solid oxide fuel cell.
15. The system of any of sections 11-13, wherein the hardware storage device further comprises a list of high priority virtual machine subscriptions.
16. The system of any of sections 11-13 further comprising:
    a second server computer,
    a second hot aisle configured to remove heat from the second server computer,
    a second fuel cell in electrical communication with the second server computer,
    a second fuel cell exhaust configured to remove heat from the second fuel cell, and
    a second thermoelectric generator positioned between the second hot aisle and the second fuel cell exhaust,
    wherein the processor is in data communication with the second server computer and the instructions further comprise allocating virtual machine placements on either the first server computer or the second server computer.
17. A method of controlling energy consumption in a datacenter, the method comprising:

receiving a fuel cell operating percentage of an operating capacity of the fuel cell;
receiving a fuel cell exhaust temperature;
receiving a hot aisle air temperature from a hot aisle of a server;
receiving an exhaust fan speed;
determining a temperature delta between the hot aisle air temperature and the fuel cell exhaust temperature; and
optimizing a server user percentage relative to a server user capacity percentage target value, the fuel cell operating percentage relative to a fuel cell efficiency target value, and the temperature delta relative to a thermoelectric generator efficiency target value.

18. The method of section 17, wherein optimizing the temperature delta relative to the thermoelectric generator efficiency target value includes changing the exhaust fan speed to change the hot aisle air temperature.

19. The method of sections 17 or 18, wherein optimizing the temperature delta relative to the thermoelectric generator efficiency target value includes moving a damper of the hot aisle to change the hot aisle air temperature.

20. The method of any of sections 17-19 further comprising:
receiving a hot aisle air pressure;
receiving a fuel cell exhaust pressure; and
determining an air pressure delta between the hot aisle air pressure and the fuel cell exhaust pressure,
wherein optimizing the server user percentage relative to a server user capacity percentage target value, the fuel cell operating percentage relative to the fuel cell efficiency target value, the temperature delta relative to the thermoelectric generator efficiency target value, and the server user capacity percentage target value further includes optimizing the pressure delta relative to the thermoelectric generator efficiency target value.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method of controlling energy in a datacenter, the method comprising:
receiving a fuel cell operating percentage of an operating capacity of the fuel cell;
receiving a fuel cell exhaust temperature;
receiving a hot aisle air temperature from a hot aisle of a server computer;
determining a temperature delta between the hot aisle air temperature and the fuel cell exhaust temperature; and
allocating virtual machine placements to the server computer to change a server user percentage relative to a server user capacity percentage target value so as to optimize the fuel cell operating percentage relative to a fuel cell efficiency target value, the temperature delta relative to a thermoelectric generator efficiency target value, and the server user percentage relative to a server user capacity percentage target value.

2. The method of claim 1, wherein the fuel cell operating percentage relative to the fuel cell efficiency target value is prioritized over the temperature delta relative to the thermoelectric generator efficiency target value and the server user percentage relative to the server user capacity percentage target value.

3. The method of claim 1, wherein the temperature delta relative to the thermoelectric generator efficiency target value is prioritized over the fuel cell operating percentage relative to the fuel cell efficiency target value and the server user percentage relative to the server user capacity percentage target value.

4. The method of claim 1, wherein the server user percentage relative to the server user capacity percentage target value is prioritized over the temperature delta relative to the thermoelectric generator efficiency target value and the fuel cell operating percentage relative to the fuel cell efficiency target value.

5. The method of claim 1, wherein the fuel cell efficiency target value is between 70% and 90%.

6. The method of claim 1, wherein the thermoelectric generator efficiency target value is an average thermoelectric generator efficiency target value for a plurality of thermoelectric generators.

7. The method of claim 1, wherein the thermoelectric generator efficiency target value is a plurality of thermoelectric generator efficiency target values for a plurality of thermoelectric generators along a length of the hot aisle.

8. The method of claim 1, wherein the server user capacity percentage target value is between 50% and 90%.

9. The method of claim 1, wherein at least one of the fuel cell efficiency target value, the thermoelectric generator efficiency target value, and the server user capacity percentage target value is a range of values.

10. The method of claim 1, wherein optimizing at least one of the fuel cell efficiency target value, the thermoelectric generator efficiency target value, and the server user capacity percentage target value includes achieving a corresponding measured value within a preset range of the fuel cell efficiency target value, the thermoelectric generator efficiency target value, and the server user capacity percentage target value.

11. A system for controlling energy consumption in a datacenter, the system comprising:
a server computer;
a hot aisle configured to remove heat from the server computer;
a fuel cell in electrical communication with the server computer;
a fuel cell exhaust configured to remove heat from the fuel cell;
a thermoelectric generator positioned between the hot aisle and the fuel cell exhaust; and
a processor in data communication with at least the server computer; and
a hardware storage device in data communication with the processor, the hardware storage device having instructions stored thereon that, when executed by the processor cause the processor to:
allocate virtual machine placements to the server computer to optimize a fuel cell operating percentage relative to a fuel cell efficiency target value, a temperature delta relative to a thermoelectric generator efficiency target value and a server user percentage relative to a server user capacity percentage target value.

12. The system of claim 11 further comprising an exhaust fan to draw air through the hot aisle.

13. The system of claim 11 further comprising a damper to restrict air flow through the hot aisle.

14. The system of claim 11, wherein the fuel cell is a solid oxide fuel cell.

15. The system of claim 11, wherein the hardware storage device further comprises a list of high priority virtual machine subscriptions.

16. The system of claim 11 further comprising:
a second server computer,
a second hot aisle configured to remove heat from the second server computer,
a second fuel cell in electrical communication with the second server computer,
a second fuel cell exhaust configured to remove heat from the second fuel cell, and
a second thermoelectric generator positioned between the second hot aisle and the second fuel cell exhaust,
wherein the processor is in data communication with the second server computer and the instructions further comprise allocating virtual machine placements on either a first server computer or the second server computer.

17. A method of controlling energy consumption in a datacenter, the method comprising:
receiving a fuel cell operating percentage of an operating capacity of the fuel cell;
receiving a fuel cell exhaust temperature;
receiving a hot aisle air temperature from a hot aisle of a server;
receiving an exhaust fan speed;
determining a temperature delta between the hot aisle air temperature and the fuel cell exhaust temperature; and
optimizing a server user percentage relative to a server user capacity percentage target value, the fuel cell operating percentage relative to a fuel cell efficiency target value, and the temperature delta relative to a thermoelectric generator efficiency target value.

18. The method of claim 17, wherein optimizing the temperature delta relative to the thermoelectric generator efficiency target value includes changing the exhaust fan speed to change the hot aisle air temperature.

19. The method of claim 17, wherein optimizing the temperature delta relative to the thermoelectric generator efficiency target value includes moving a damper of the hot aisle to change the hot aisle air temperature.

20. The method of claim 17 further comprising:
receiving a hot aisle air pressure;
receiving a fuel cell exhaust pressure; and
determining an air pressure delta between the hot aisle air pressure and the fuel cell exhaust pressure,
wherein optimizing the server user percentage relative to a server user capacity percentage target value, the fuel cell operating percentage relative to the fuel cell efficiency target value, the temperature delta relative to the thermoelectric generator efficiency target value, and the server user capacity percentage target value further includes optimizing the air pressure delta relative to the thermoelectric generator efficiency target value.

* * * * *